(12) United States Patent
Suzuki et al.

(10) Patent No.: US 9,134,423 B2
(45) Date of Patent: Sep. 15, 2015

(54) RANGE SENSOR AND RANGE IMAGE SENSOR

(75) Inventors: Takashi Suzuki, Hamamatsu (JP); Mitsuhito Mase, Hamamatsu (JP)

(73) Assignee: HAMAMATSU PHOTONICS K.K., Hamamatsu-shi, Shizuoka (JP)

(*) Notice: Subject to any disclaimer, the term of this patent is extended or adjusted under 35 U.S.C. 154(b) by 848 days.

(21) Appl. No.: 13/497,350

(22) PCT Filed: Oct. 26, 2010

(86) PCT No.: PCT/JP2010/068903
§ 371 (c)(1),
(2), (4) Date: Mar. 21, 2012

(87) PCT Pub. No.: WO2011/065167
PCT Pub. Date: Jun. 3, 2011

(65) Prior Publication Data
US 2012/0236145 A1 Sep. 20, 2012

(30) Foreign Application Priority Data
Nov. 24, 2009 (JP) ................. 2009-266418

(51) Int. Cl.
| | |
|---|---|
| H04N 7/18 | (2006.01) |
| G01S 17/89 | (2006.01) |
| G01B 11/02 | (2006.01) |
| G01B 11/00 | (2006.01) |
| G01S 17/10 | (2006.01) |
| G01S 7/486 | (2006.01) |
| G01S 11/12 | (2006.01) |
| H01L 27/146 | (2006.01) |

(52) U.S. Cl.
CPC ............... *G01S 17/89* (2013.01); *G01B 11/002* (2013.01); *G01B 11/022* (2013.01); *G01S 7/4863* (2013.01); *G01S 17/10* (2013.01); *H04N 7/18* (2013.01); *G01S 11/12* (2013.01); *H01L 27/14603* (2013.01)

(58) Field of Classification Search
CPC ...... G01B 11/022; G01B 11/002; H04N 7/18; G01S 11/12
USPC .................... 348/135, 142, 139, 140
See application file for complete search history.

(56) References Cited

U.S. PATENT DOCUMENTS 4,873,561 A * 10/1989 Wen ................................ 377/62
6,166,768 A * 12/2000 Fossum et al. ................ 348/308

FOREIGN PATENT DOCUMENTS

| JP | 2005-530171 | 10/2005 |
| JP | 2007-526448 | 9/2007 |
| JP | 2008-89346 | 4/2008 |
| WO | 2009/139312 | 11/2009 |

* cited by examiner

*Primary Examiner* — Shawn An
(74) *Attorney, Agent, or Firm* — Drinker Biddle & Reath LLP

(57) ABSTRACT

A photogate electrode PG has first and second sides opposed to each other. First and second semiconductor regions FD1, FD2 are arranged as spatially separated from each other on the side where the first side of the photogate electrode PG exists and along the first side. Third and fourth semiconductor regions FD3, FD4 are arranged as spatially separated from each other on the side where the second side of the photogate electrode PG exists and along the second side. First gate electrodes TX1 are provided between the photogate electrode PG and the first and third semiconductor regions FD1, FD3. Second gate electrodes TX2 are provided between the photogate electrode PG and the second and fourth semiconductor regions FD2, FD4. The first to fourth semiconductor regions FD1-FD4 are formed so as to overlap with respective p-type well regions W1-W4 and so as to be surrounded by the respective well regions W1-W4.

7 Claims, 14 Drawing Sheets

(a)

(b)

(a)

(b)

(a)

(b)

(a)

(b)

RANGE SENSOR AND RANGE IMAGE SENSOR

TECHNICAL FIELD

The present invention relates to a range sensor and a range image sensor.

BACKGROUND ART

A conventional active type optical distance measuring sensor is known as a device configured to irradiate light from a light source for projection of light such as an LED (Light Emitting Diode) toward an object, to detect reflected light from the object with a photodetecting element, and thereby to output a signal according to the distance to the object. For example, a PSD (Position Sensitive Detector) is known as an optical distance measuring sensor of an optical triangulation type capable of readily measuring the distance to the object, and in recent years there are expectations for development of an optical distance measuring sensor of an optical TOF (Time-Of-Flight) type, in order to achieve more accurate distance measurement.

There are demands for an image sensor capable of simultaneously acquiring distance information and image information by a single chip, for example, in on-vehicle use, use in automatic manufacture systems in factories, and so on. With the image sensor being installed in the front portion of a vehicle, its expected use is to detect and recognize a preceding vehicle or to detect and recognize a pedestrian or the like. There are also expectations for an image sensor capable of acquiring a range image consisting of a single piece of distance information or multiple pieces of distance information, separately from the image information. It is preferable to apply the TOF method to such a distance measuring sensor.

In the TOF method, pulsed light is emitted from a light source for projection of light toward an object and the pulsed light reflected by the object is detected by a photodetecting element to measure a time difference between the emission timing and the detection timing of pulsed light. This time difference ($\Delta t$) is a time for the pulsed light to travel a distance (2×d) twice as long as the distance d to the object, at the speed of light (=c), and therefore the relation of $d=(c\times\Delta t)/2$ holds. The time difference ($\Delta t$) can be translated into a phase difference between pulses emitted from the light source and detected pulses. The distance d to the object can be obtained by detecting the phase difference.

An image sensor of a charge distribution type has been attracting attention as a photodetecting element for distance measurement by the TOF method. Specifically, the image sensor of the charge distribution type is configured, for example, to distribute a charge generated in the image sensor according to incidence of a detected pulse into one potential well during an ON duration of an emitted pulse and into the other potential well during an OFF duration. In this case, a ratio of charge quantities distributed right and left is proportional to the phase difference between the detected pulse and the emitted pulse, i.e., the time necessary for the pulsed light to travel the distance twice as long as the distance to the object at the speed of light. There are various conceivable methods of the charge distribution type.

Patent Literature 1 discloses the range sensor (range image sensor) of the charge distribution method, which comprises a semiconductor substrate, a photogate electrode provided on a surface of the semiconductor substrate and having a planar shape with two sides opposed to each other, a plurality of transfer electrodes provided respectively next to two sides of the photogate electrode on the surface, and a plurality of semiconductor regions having the conductivity type different from that of the semiconductor substrate and provided for accumulating respective charges flowing from a region immediately below the photogate electrode into regions immediately below the respective transfer electrodes.

Patent Literature 2 discloses the range sensor (range image sensor) of the same charge distribution method, which comprises a semiconductor substrate, a rectangular electrode provided through an insulating layer on the semiconductor substrate, four electrode contacts provided on the electrode and next to two opposed sides of the electrode, and four charge collection diffusion regions arranged next to the two sides of the electrode, having the conductivity type different from that of the semiconductor substrate, and configured to accumulate respective charges flowing from the region immediately below the electrode.

CITATION LIST

Patent Literatures

Patent Literature 1: Published Japanese Translation of PCT Application No. 2007-526448
Patent Literature 2: Published Japanese Translation of PCT Application No. 2005-530171

SUMMARY OF INVENTION

Technical Problem

If a depletion layer spreading from the region immediately below the photogate electrode is coupled with depletion layers spreading from the respective semiconductor regions, the charge generated with incidence of light can directly flow into each of the semiconductor regions, so as to cause crosstalk. In order to suppress the crosstalk, it is conceivable to provide well regions having the same conductivity type as that of the semiconductor substrate and an impurity concentration higher than that of the semiconductor substrate, so as to overlap with the respective semiconductor regions. In this case, it is feasible to control the thickness of depletion layers spreading from interfaces between the semiconductor regions and the well regions, and to prevent the depletion layers from coupling with the depletion layer spreading from the region immediately below the photogate electrode, so as to suppress the crosstalk.

Incidentally, if during formation of the semiconductor regions and the well regions masks for formation of the respective regions have a positional deviation in an opposed direction in which the transfer electrodes (semiconductor regions) are opposed to each other (a direction in which the charge flows from the region immediately below the photogate electrode into the semiconductor regions), relative positions of the semiconductor regions and the well regions will have a deviation in the opposed direction and regions where the semiconductor regions and the well regions overlap with each other (which will also be referred to hereinafter simply as "overlap regions") will have different widths in the aforementioned opposed direction. In this case, if the width of the overlap regions between the semiconductor regions and the well regions increases in the opposed direction, a flat portion will be formed in a potential slope toward the semiconductor regions, so as to cause a hindrance to flow of charge. This makes a potential slope toward one semiconductor region different from a potential slope toward the other semiconductor region, to make a difference between accumulation capacities in the respective semiconductor regions, which will result in difference in sensitivity to charge transfer signals supplied to the respective transfer electrodes. Namely, it becomes infeasible to appropriately distribute the charge into the plurality of semiconductor regions.

Since the range sensor (range image sensor) of the charge distribution method is configured to detect the time delay of pulsed light incident into the sensor on the basis of the ratio of distributed charge quantities as described above, the detected time delay will have an error unless the charge is appropriately distributed into the semiconductor regions.

It is an object of the present invention to provide a range sensor and a range image sensor capable of appropriately distributing the charge generated in the region immediately below the photogate electrode, into the semiconductor regions even if the masks have the positional deviation in formation of the semiconductor regions and well regions.

Solution to Problem

A range sensor according to the present invention is a range sensor comprising: a semiconductor substrate; a photogate electrode provided on a surface of the semiconductor substrate and having a planar shape with a first side and a second side opposed to each other; first and second semiconductor regions arranged as spatially separated from each other on the side where the first side of the photogate electrode exists and along the first side, having a conductivity type different from that of the semiconductor substrate, and configured to accumulate charge generated in a region immediately below the photogate electrode; third and fourth semiconductor regions arranged as spatially separated from each other on the side where the second side of the photogate electrode exists and along the second side and as opposed to the first and second semiconductor regions with the photogate electrode in between in an opposed direction in which the first side and the second side are opposed, having the conductivity type different from that of the semiconductor substrate, and configured to accumulate charge generated in the region immediately below the photogate electrode; well regions having the same conductivity type as the semiconductor substrate and an impurity concentration higher than an impurity concentration of the semiconductor substrate, and provided so as to overlap with the first to fourth respective semiconductor regions; and first transfer electrodes provided respectively between the first and third semiconductor regions and the photogate electrode on the surface and second transfer electrodes provided respectively between the second and fourth semiconductor regions and the photogate electrode on the surface, to which charge transfer signals of different phases are supplied.

In the range sensor according to the present invention, the first and second semiconductor regions are arranged on the side where the first side of the photogate electrode exists, the first transfer electrode is provided between the photogate electrode and the first semiconductor region, and the second transfer electrode to which the charge transfer signal of the phase different from that of the first transfer electrode is supplied is provided between the photogate electrode and the second semiconductor region. The third and fourth semiconductor regions are arranged on the side where the second side of the photogate electrode exists, the first transfer electrode is provided between the photogate electrode and the third semiconductor region, and the second transfer electrode is provided between the photogate electrode and the fourth semiconductor region.

If during formation of the first to fourth semiconductor regions and the well regions masks for formation of the respective regions have a positional deviation in the opposed direction, the widths of the overlap regions between the first to fourth semiconductor regions and the well regions will be different in the opposed direction, as described above. In the present invention, the first semiconductor region and the third semiconductor region to which the charge is transferred by the first transfer electrodes are arranged on the side where the first side of the photogate electrode exists and on the side where the second side of the photogate electrode exists. Therefore, while the width of the overlap region between the first semiconductor region and the well region decreases in the opposed direction, the width of the overlap region between the third semiconductor region and the well region increases in the opposed direction. On the contrary, while the width of the overlap region between the first semiconductor region and the well region increases in the opposed direction, the width of the overlap region between the third semiconductor region and the well region decreases in the opposed direction. For this reason, in an operation to transfer the charge generated in the region immediately below the photogate electrode, to the first and third semiconductor regions with application of the synchronized charge transfer signal to each first transfer electrode, even if a flat portion is formed in a potential slope toward one semiconductor region out of the first and third semiconductor regions, no flat portion is formed in a potential slope toward the other semiconductor region. As a consequence, there is no hindrance to transfer of charge to the other semiconductor region.

In the present invention, the second semiconductor region and the fourth semiconductor region to which the charge is transferred by the second transfer electrodes are arranged on the side where the first side of the photogate electrode exists and on the side where the second side of the photogate electrode exists. For this reason, in an operation to transfer the charge generated in the region immediately below the photogate electrode, to the second and fourth semiconductor regions with application of the synchronized charge transfer signal to each second transfer electrode, even if a flat portion is formed in a potential slope toward one semiconductor region out of the second and fourth semiconductor regions, no flat portion is formed in a potential slope toward the other semiconductor region. As a consequence, there is no hindrance to transfer of charge to the other semiconductor region.

From the above discussion, the charge generated in the region immediately below the photogate electrode can be appropriately distributed into the first and third semiconductor regions and into the second and fourth semiconductor regions even if the masks have a positional deviation in formation of the first to fourth semiconductor regions and the well regions. As a result, it is feasible to suppress an imbalance due to the positional deviation of the masks between the quantity of charge accumulated in the first and third semiconductor regions and the quantity of charge accumulated in the second and fourth semiconductor regions.

In the range sensor described in Patent Literature 2, two charge collection diffusion regions are provided for each of the two opposed sides of the rectangular electrode. In the range sensor described in Patent Literature 2, however, since the voltage signals of different phases are supplied to the four respective charge collection diffusion regions, there is an imbalance due to the positional deviation of the masks among quantities of charge accumulated in the four respective charge collection diffusion regions. Therefore, the range sensor described in Patent Literature 2 fails to provide a solution to the aforementioned problem noted in the present invention.

A range image sensor according to the present invention is a range image sensor comprising: the aforementioned range sensor; a light source; a driving circuit to supply a pulse driving signal to the light source; a controlling circuit to supply charge transfer signals synchronized with the pulse driving signal and having mutually different phases, to the first and second transfer electrodes, respectively; and an arithmetic circuit to calculate a distance to an object from signals read out from the first to fourth semiconductor regions. Since the range image sensor according to the present invention comprises the aforementioned range sensor, it is able to prevent degradation of distance detection accuracy.

In the present invention, the range sensor may be configured as follows: it further comprises a fifth semiconductor region arranged as spatially separated from the first and second semiconductor regions on the side where the first side of the photogate electrode exists and along the first side, having the conductivity type different from that of the semiconductor substrate, and configured to accumulate charge generated in the region immediately below the photogate electrode; and a sixth semiconductor region arranged as spatially separated from the third and fourth semiconductor regions on the side where the second side of the photogate electrode exists and along the second side and as opposed to the fifth semiconductor region with the photogate electrode in between in the opposed direction, having the conductivity type different from that of the semiconductor substrate, and configured to collect charge generated in the region immediately below the photogate electrode; the well regions are provided so as to overlap with the fifth and sixth respective semiconductor regions; the range sensor further comprises: the first transfer electrode disposed between the fifth semiconductor region and the photogate electrode on the surface; and the second transfer electrode disposed between the sixth semiconductor region and the photogate electrode on the surface. In this case, on each side of the first side and the second side, a total of lengths of the first transfer electrodes is preferably equal to a total of lengths of the second transfer electrodes. Particularly, when the total of the lengths of the first transfer electrodes is equal to the total of the lengths of the second transfer electrodes, it is feasible to further suppress the imbalance due to the positional deviation of the masks between the quantity of charge accumulated in the first, third, and fifth semiconductor regions and the quantity of charge accumulated in the second, fourth, and sixth semiconductor regions.

A range image sensor according to the present invention comprises: the aforementioned range sensor; a light source; a driving circuit to supply a pulse driving signal to the light source; a controlling circuit to supply charge transfer signals synchronized with the pulse driving signal and having mutually different phases, to the first and second transfer electrodes, respectively; and an arithmetic circuit to calculate a distance to an object from signals read out from the first to sixth semiconductor regions. Since the range image sensor according to the present invention comprises the aforementioned range sensor, it is able to prevent the degradation of the distance detection accuracy.

In the present invention, the range sensor may be configured as follows: the planar shape of the photogate electrode further has a third side and a fourth side opposed to each other; the range sensor further comprises: seventh and eighth semiconductor regions arranged as spatially separated from each other on the side where the third side of the photogate electrode exists and along the third side, having the conductivity type different from that of the semiconductor substrate, and configured to accumulate charge generated in the region immediately below the photogate electrode; ninth and tenth semiconductor regions arranged as spatially separated from each other on the side where the fourth side of the photogate electrode exists and along the fourth side and as opposed to each other with the photogate electrode in between in an opposed direction in which the third side and the fourth side are opposed, having the conductivity type different from that of the semiconductor substrate, and configured to accumulate charge generated in the region immediately below the photogate electrode; and third transfer electrodes provided respectively between the seventh and ninth semiconductor regions and the photogate electrode on the surface and fourth transfer electrodes provided respectively between the eighth and tenth semiconductor regions and the photogate electrode on the surface, to which charge transfer signals of different phases are supplied; the well regions are provided so as to overlap with the seventh to ninth respective semiconductor regions. In this case, even if during formation of the seventh to tenth semiconductor regions and the well regions the masks for formation of the respective regions have a positional deviation in a direction perpendicular to the aforementioned opposed direction, the charge generated in the region immediately below the photogate electrode can be appropriately distributed into the seventh and ninth semiconductor regions and into the eighth and tenth semiconductor regions, as in the case of the relation among the first to fourth semiconductor regions. As a result, it is feasible to prevent the imbalance due to the positional deviation of the masks between the quantity of charge accumulated in the seventh and ninth semiconductor regions and the quantity of charge accumulated in the eighth and tenth semiconductor regions.

A range image sensor according to the present invention comprises: the aforementioned range sensor; a light source; a driving circuit to supply a pulse drive signal to the light source; a controlling circuit to supply charge transfer signals synchronized with the pulse drive signal and having mutually different phases, to the first to fourth transfer electrodes, respectively; and an arithmetic circuit to calculate a distance to an object from signals read out from the first to fourth semiconductor regions and the seventh to tenth semiconductor regions. Since the range image sensor according to the present invention comprises the aforementioned range sensor, it is able to prevent the degradation of the distance detection accuracy.

Advantageous Effects of Invention

The present invention provides the range sensors and the range image sensors capable of appropriately distributing the charge generated in the region immediately below the photogate electrode into the respective semiconductor regions even if the masks have the positional deviation in formation of the semiconductor regions and the well regions.

DESCRIPTION OF EMBODIMENTS

The preferred embodiments of the present invention will be described below in detail with reference to the accompanying drawings. In the description the same elements or elements with the same functionality will be denoted by the same reference signs, without redundant description.

Figure 1:
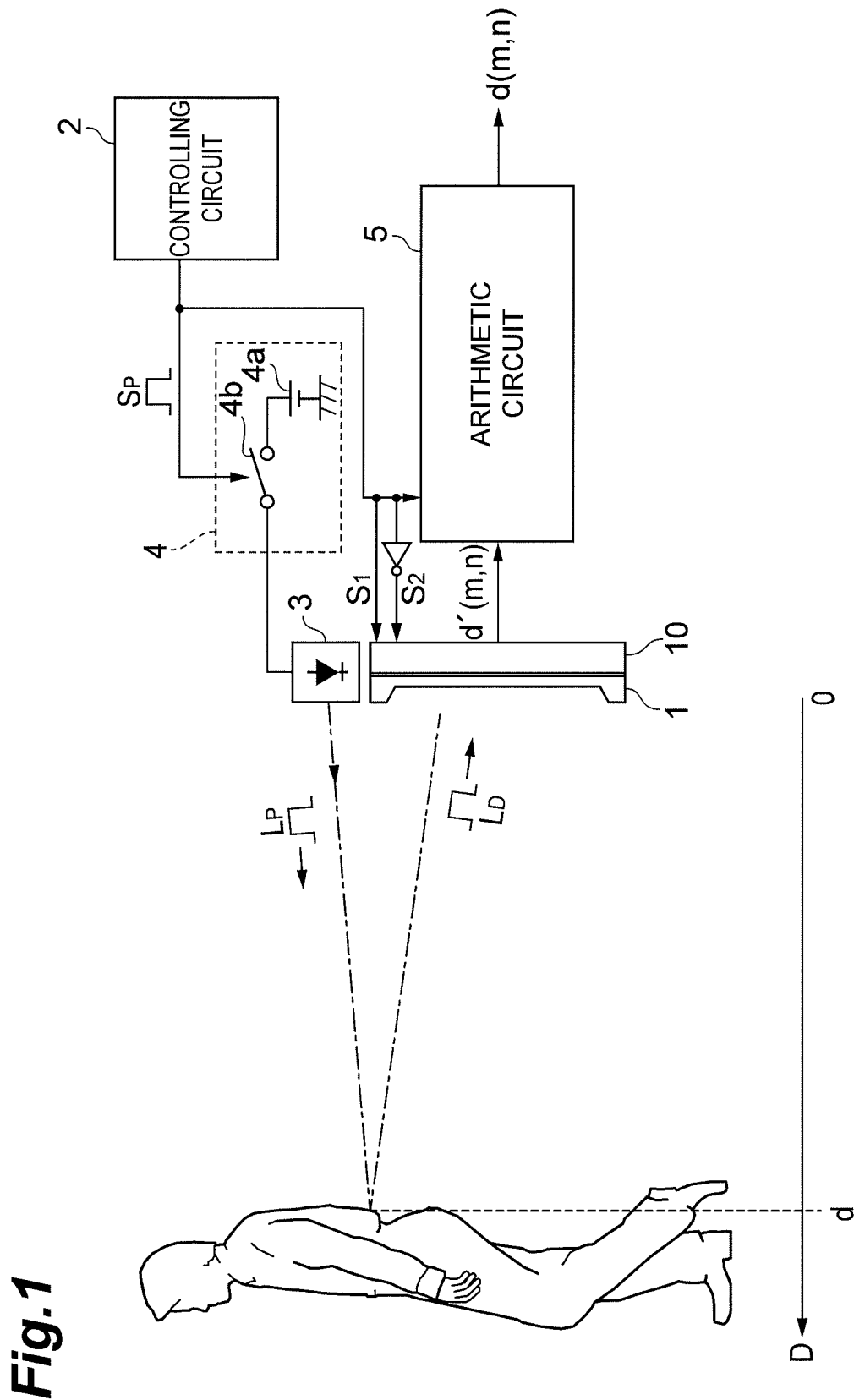
FIG. 1 is an explanatory drawing showing a configuration of a distance measuring device according to an embodiment of the present invention.

FIG. 1 is an explanatory drawing showing a configuration of a distance measuring device.

This distance measuring device is provided with a range image sensor 1, a light source 3 to emit near-infrared light, a driving circuit 4 to supply a pulse drive signal $S_P$ to the light source 3, a controlling circuit 2, and an arithmetic circuit 5. The controlling circuit 2 supplies detection gate signals $S_1$, $S_2$ in synchronism with the pulse drive signal $S_P$ to first and second gate electrodes (TX1, TX2: cf. FIG. 4) in each pixel of the range image sensor 1. The arithmetic circuit 5 calculates a distance to an object H such as a pedestrian, from a signal d'(m,n) indicative of distance information read out from first to fourth semiconductor regions (FD1-FD4: cf. FIG. 4) of the range image sensor 1. The distance in the horizontal direction D from the range image sensor 1 to the object H is represented by d.

The controlling circuit 2 feeds the pulse drive signal $S_P$ to a switch 4b of the driving circuit 4. The light source 3 for projection of light consisting of an LED or a laser diode is connected via the switch 4b to a power supply 4a. Therefore, when the pulse drive signal $S_P$ is fed to the switch 4b, a drive current of the same waveform as the pulse drive signal $S_P$ is supplied to the light source 3 and the light source 3 outputs pulsed light $L_P$ as probe light for distance measurement.

When the pulsed light $L_P$ is irradiated on the object H, the object H reflects the pulsed light. Then the reflected light is incident as pulsed light $L_D$ into the range image sensor 1 and the range image sensor 1 outputs a pulse detection signal $S_D$.

The range image sensor 1 is fixed on a wiring board 10. In the range image sensor 1, a signal d'(m,n) having distance information is output from each pixel through wiring on the wiring board 10.

The waveform of the pulse drive signal $S_P$ is a rectangular wave with the period T and the voltage V(t) thereof is given by the following formulae, where "1" represents a high level and "0" a low level. Pulse drive signal $S_P$:

$V(t)=1$ (in the case of $0<t<(T/2)$);

$V(t)=0$ (in the case of $(T/2)<t<T$);

$V(t+T)=V(t)$.

The waveforms of the detection gate signals $S_1$, $S_2$ are rectangular waves with the period T and the voltage V(t) thereof is given by the following formulae.
Detection gate signal $S_1$:

$V(t)=1$ (in the case of $0<t<(T/2)$);

$V(t)=0$ (in the case of $(T/2)<t<T$);

$V(t+T)=V(t)$.

Detection gate signal $S_2$ (=inversion of $S_1$):

$V(t)=0$ (in the case of $0<t<(T/2)$);

$V(t)=1$ (in the case of $(T/2)<t<T$);

$V(t+T)=V(t)$.

The foregoing pulse signals $S_P$, $S_1$, $S_2$, $S_D$ all have the pulse period $2\times T_P$. Let Q1 be a charge quantity generated in the range image sensor 1 with the detection gate signal $S_1$ and the pulse detection signal $S_D$ both being "1," and Q2 be a charge quantity generated in the range image sensor 1 with the detection gate signal $S_2$ and the pulse detection signal $S_D$ both being "1."

A phase difference between one detection gate signal $S_1$ and the pulse detection signal $S_D$ in the range image sensor 1 is proportional to the charge quantity Q2 generated in the range image sensor 1, in an overlap duration in which the other detection gate signal $S_2$ and the pulse detection signal $S_D$ are "1." Namely, the charge quantity Q2 is a charge quantity generated in the duration in which AND of the detection gate signal $S_2$ and the pulse detection signal $S_D$ is "1." When a total charge quantity generated in one pixel is Q1+Q2 and the pulse width of a half period of the drive signal $S_P$ is $T_P$, the pulse detection signal $S_D$ lags behind the drive signal $S_P$ by a time of $\Delta t = T_P \times Q2/(Q1+Q2)$. The time of flight $\Delta t$ of one light pulse is given by $\Delta t=2d/c$, where d is the distance to the object and c the speed of light. For this reason, when two charge quantities (Q1,Q2) are output as signal d' having the distance information from a specific pixel, the arithmetic circuit 5 calculates the distance $d=(c \times \Delta t)/2 = c \times T_P \times Q2/(2 \times (Q1+Q2))$ to the object H, based on the input charge quantities Q1, Q2 and the known half-period pulse width $T_P$.

As described above, the arithmetic circuit 5 can calculate the distance d by separately reading out the charge quantities Q1, Q2. The foregoing pulses are repeatedly emitted and integral values thereof can be output as respective charge quantities Q1, Q2.

The ratio to the total charge quantity of the charge quantities Q1, Q2 corresponds to the aforementioned phase difference, i.e., to the distance to the object H. The arithmetic circuit 5 calculates the distance to the object H according to this phase difference. As described above, when the time difference corresponding to the phase difference is represented by $\Delta t$, the distance d is preferably given by $d=(c \times \Delta t)/2$, but an appropriate correction operation may be performed in addition thereto. For example, if an actual distance is different from the calculated distance d, a factor β to correct the latter is preliminarily obtained and the finally calculated distance d is obtained by multiplying the factor β to the calculated distance d in a product after shipped. Another available correction is such that the outside temperature is measured, an operation to correct the speed of light c is performed if the speed of light c differs depending upon the outside temperature, and then the distance calculation is performed. It is also possible to preliminarily store in a memory a relation between signals input into the arithmetic circuit and actual distances, and determine the distance by a lookup table method. The calculation method can be modified depending upon the sensor structure and the conventionally known calculation methods can be applied thereto.

Figure 2:
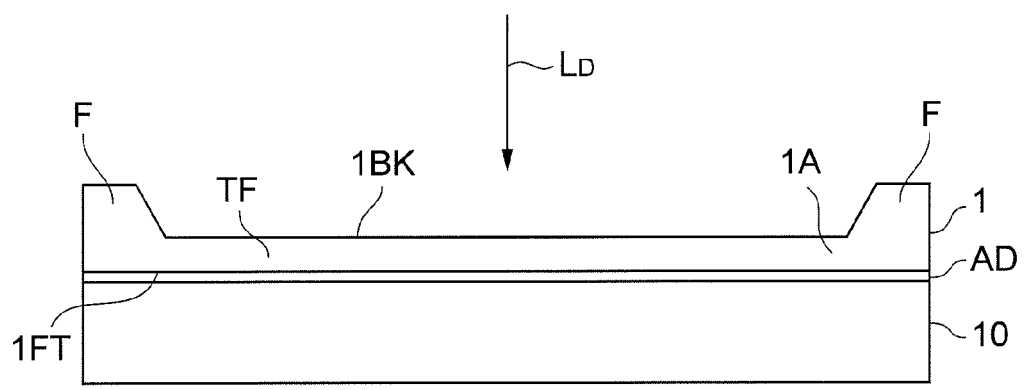
FIG. 2 is a drawing for explaining a cross-sectional configuration of a range image sensor.

FIG. 2 is a drawing for explaining a cross-sectional configuration of the range image sensor.

The range image sensor 1 has a semiconductor substrate 1A. The semiconductor substrate 1A has a frame portion F for reinforcement, and a thin plate portion TF thinner than the frame portion F, which are integrated with each other. The thickness of the thin plate portion TF is not less than 10 μm and not more than 100 μm. The thickness of the frame portion F in the present example is not less than 200 μm and not more than 1000 μm. The semiconductor substrate 1A may be thinned throughout the entire area. The pulsed light $L_D$ is incident through a light incident surface 1BK into the range image sensor 1. A surface 1FT opposite to the light incident surface 1BK of the range image sensor 1 is connected through an adhesive region AD to the wiring board 10. The adhesive region AD is a region including adhesive elements such as bump electrodes and contains an insulating adhesive and/or a filler as needed.

Figure 3:
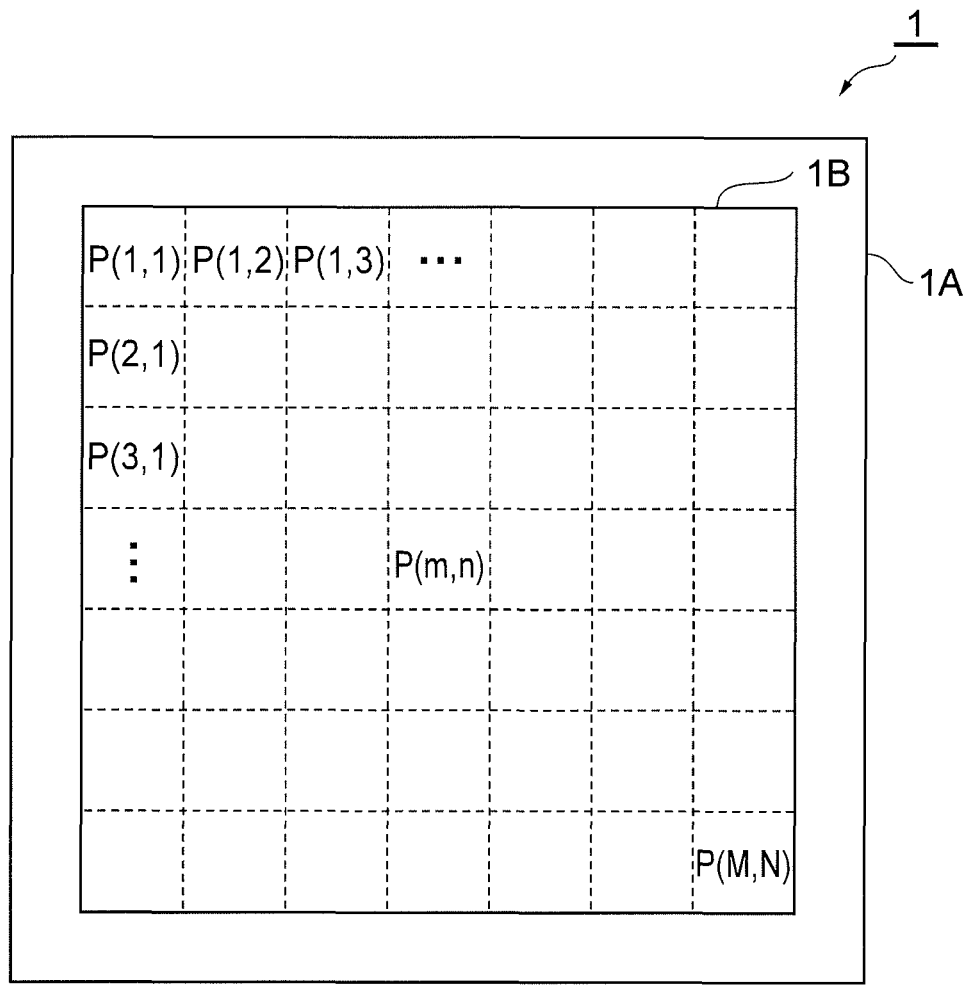
FIG. 3 is a schematic plan view of the range image sensor.

FIG. 3 is a schematic plan view of the range image sensor.

In the range image sensor 1, the semiconductor substrate 1A has an imaging region 1B consisting of a plurality of pixels P(m,n) arrayed in a two-dimensional pattern. Each pixel P(m,n) outputs two charge quantities (Q1,Q2) as the aforementioned signal d'(m,n) having the distance information. Each pixel P(m,n) functions as a microscopic distance measuring sensor to output the signal d'(m,n) according to the distance to the object H. Therefore, when the reflected light from the object H is focused on the imaging region 1B, we can obtain a range image of the object as a collection of distance information to respective points on the object H. One pixel P(m,n) functions as one range sensor.

Figure 4:
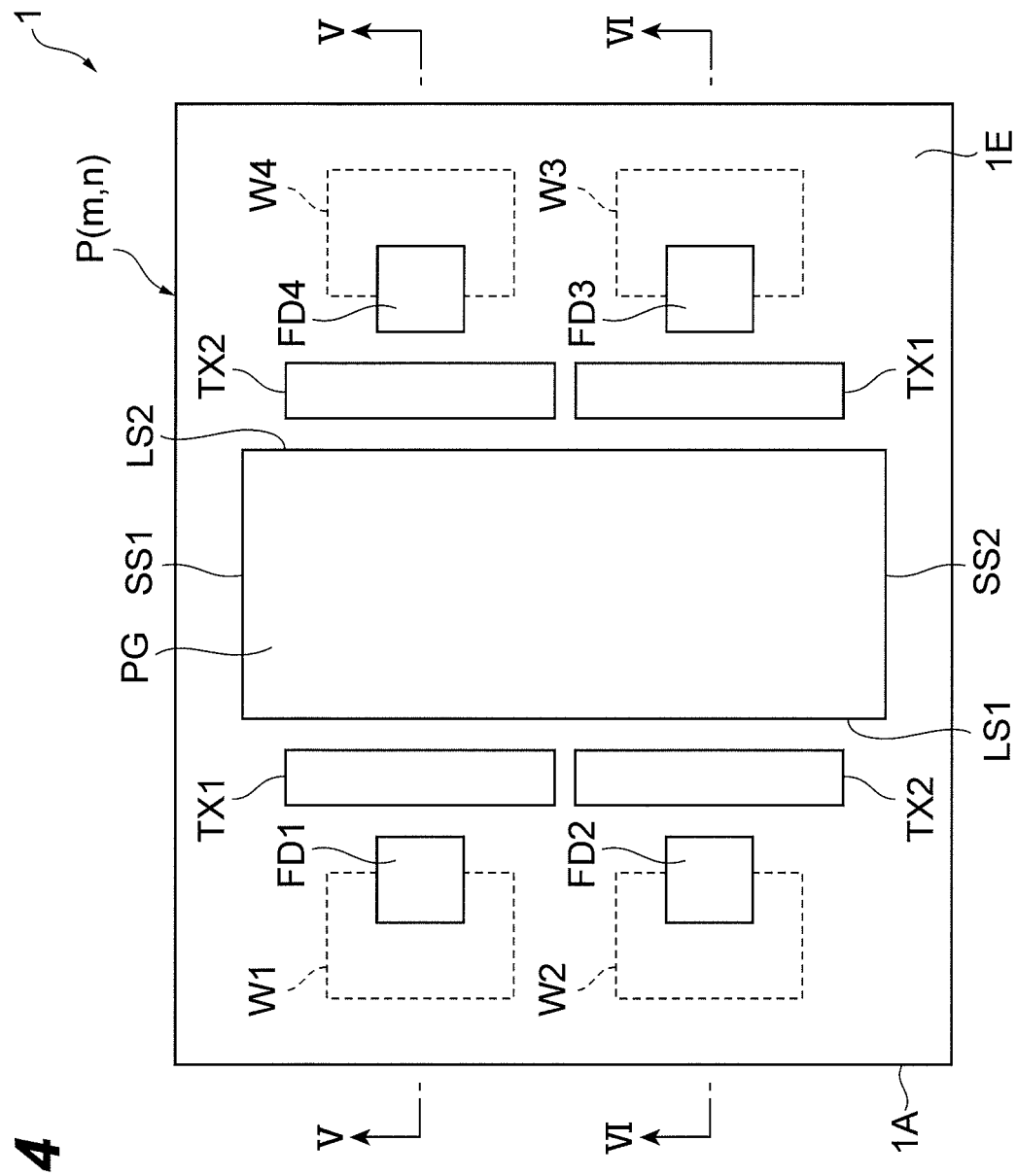
FIG. 4 is a schematic drawing for explaining a configuration of a pixel in the range image sensor.
Figure 5:
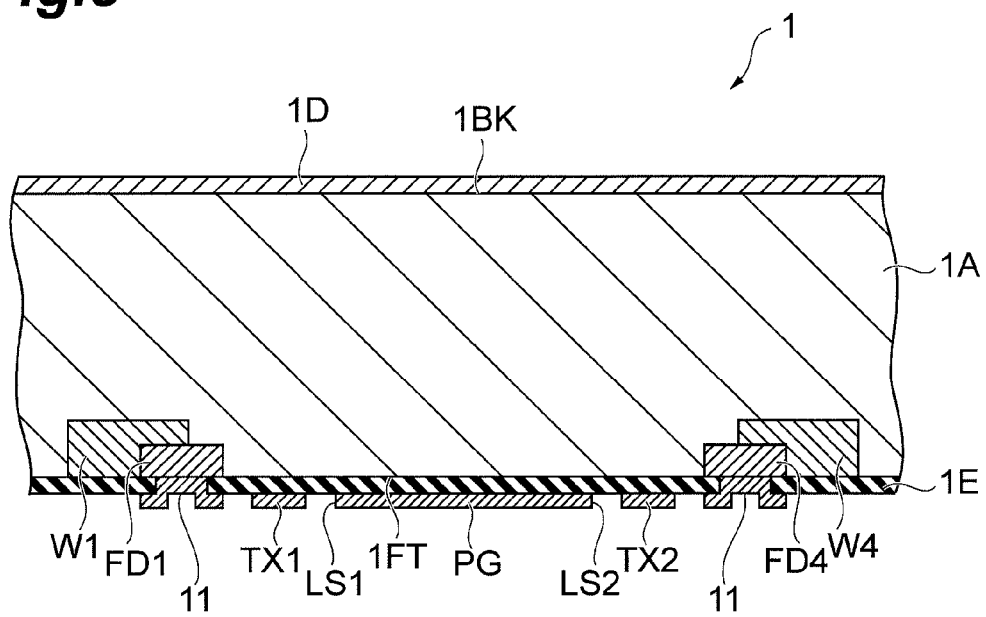
FIG. 5 is a drawing showing a cross-sectional configuration along the line V-V in FIG. 4.
Figure 6:
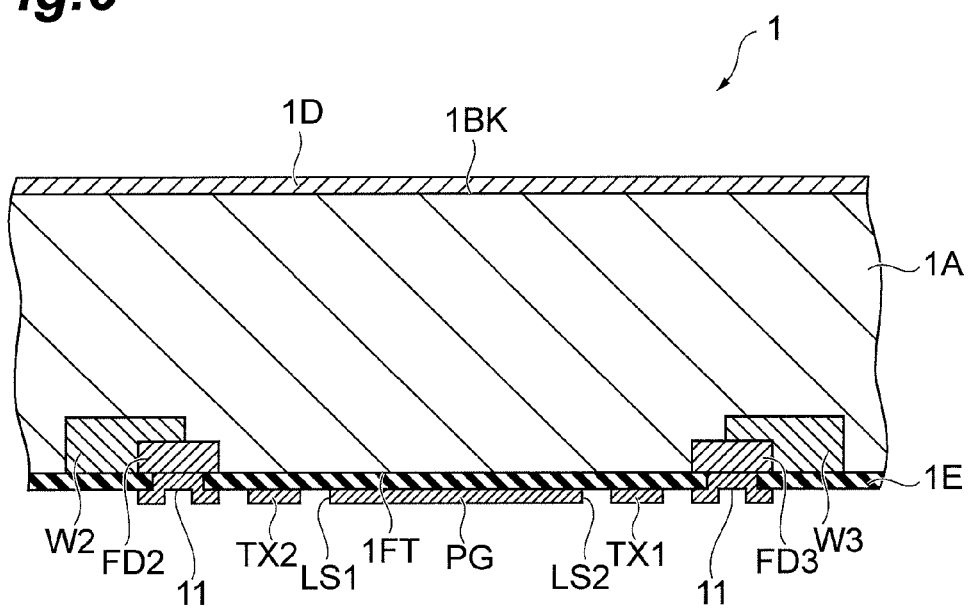
FIG. 6 is a drawing showing a cross-sectional configuration along the line VI-VI in FIG. 4.

FIG. 4 is a schematic diagram for explaining a configuration of a pixel in the range image sensor. FIG. 5 is a drawing showing a cross-sectional configuration along the line V-V in FIG. 4 and FIG. 6 a drawing showing a cross-sectional configuration along the line VI-VI in FIG. 4.

The range image sensor 1 is provided with the semiconductor substrate 1A having the light incident surface 1BK and the surface 1FT opposite to the light incident surface 1BK, a photogate electrode PG, first and second gate electrodes TX1, TX2 (first and second transfer electrodes), and first to fourth semiconductor regions FD1-FD4. The photogate electrode PG is provided through an insulating layer 1E on the surface 1FT. The first and second gate electrodes TX1, TX2 are provided next to the photogate electrode PG through the insulating layer 1E on the surface 1FT. The first to fourth semiconductor regions FD1-FD4 accumulate respective charges flowing into regions immediately below the respective gate electrodes TX1, TX2. In the present example, the semiconductor substrate 1A is comprised of Si and the insulating layer 1E is comprised of $SiO_2$. The semiconductor substrate 1A may be comprised of an epitaxial layer.

The photogate electrode PG has a rectangular shape on the plan view. In the present embodiment, the photogate electrode PG has a rectangle shape. Namely, the photogate electrode PG has a planar shape having first and second long sides LS1, LS2 opposed to each other, and first and second short sides SS1, SS2 opposed to each other. A region corresponding to the photogate electrode PG in the semiconductor substrate 1A (a region immediately below the photogate electrode PG) functions as a photosensitive region where charge is generated according to incident light. The photogate electrode PG is comprised of polysilicon but may be comprised of another material different from it.

The first and second semiconductor regions FD1, FD2 are arranged as spatially separated from each other on the side where the first long side LS1 of the photogate electrode PG exists and along the first long side LS1. The third and fourth semiconductor regions FD3, FD4 are arranged as spatially separated from each other on the side where the second long side LS2 of the photogate electrode PG exists and along the second long side LS2. The first semiconductor region FD1 and the fourth semiconductor region FD4 are opposed to each other with the photogate electrode PG in between, in a direction in which the first and second long sides LS1, LS2 are opposed (which will also be sometimes referred to simply as "opposed direction"). The second semiconductor region FD2 and the third semiconductor region FD3 are opposed to each other with the photogate electrode PG in between, in the foregoing opposed direction.

The first gate electrode TX1 is disposed between the photogate electrode PG and the first semiconductor region FD1. The second gate electrode TX2 is disposed between the photogate electrode PG and the second semiconductor region FD2. The first gate electrode TX1 is also disposed between the photogate electrode PG and the third semiconductor region FD3. The second gate electrode TX2 is also disposed between the photogate electrode PG and the fourth semiconductor region FD4. The first and second gate electrodes TX1, TX2 have a rectangular shape on the plan view. In the present embodiment, the first and second gate electrodes TX1, TX2 have a rectangle shape having the long-side direction parallel to the long-side direction of the photogate electrode PG. The lengths in the long-side direction of the first and second gate electrodes TX1, TX2 are set to the same length. The first and second gate electrodes TX1, TX2 are comprised of polysilicon, but may be comprised of another material different from it.

The semiconductor substrate 1A is comprised of a p-type semiconductor substrate with a low impurity concentration. The first to fourth semiconductor regions FD1-FD4 are floating diffusion regions comprised of an n-type semiconductor with a high impurity concentration. The first to fourth semiconductor regions FD1-FD4 are formed so as to overlap with respective p-type well regions W1-W4 and be surrounded thereby. The perimeters of the first to fourth semiconductor regions FD1-FD4 are surrounded by the well regions W1-W4 having a concentration much higher than the impurity concentration of the substrate and regions immediately below the first and second gate electrodes TX1, TX2. This makes it feasible to suppress the spread of depletion layers from the respective semiconductor regions FD1-FD4, to reduce leak current, and to reduce capture of unnecessary charge due to crosstalk and stray light. The well regions W1-W4 prevent the depletion layer spreading with application of voltage to the photogate electrode PG from being coupled with the depletion layers spreading from the first to fourth semiconductor regions FD1-FD4.

The thicknesses/impurity concentrations of the respective semiconductor regions are as described below.

Semiconductor substrate 1A: thickness 10-1000 μm/impurity concentration $1\times10^{12}$-$10^{15}$ cm$^{-3}$ Well regions W1-W4: thickness 0.5-5 μm/impurity concentration $1\times10^{16}$-$10^{18}$ cm$^{-3}$ Semiconductor regions FD1-FD4: thickness 0.1-1 μm/impurity concentration $1\times10^{18}$-$10^{20}$ cm$^{-3}$ The insulating layer 1E is provided with contact holes for exposing the surfaces of the first to fourth semiconductor regions FD1-FD4. Conductors 11 to connect the first to fourth semiconductor regions FD1-FD4 to the outside are arranged in the contact holes. In FIG. 4, illustration of the conductors 11 is omitted.

The first to fourth semiconductor regions FD1-FD4 are partly in contact with the regions immediately below the respective gate electrodes TX1, TX2 in the semiconductor substrate 1A. An antireflection film 1D is provided on the side where the light incident surface 1BK of the semiconductor substrate 1A exists. A material of the antireflection film 1D is SiO$_2$ or SiN.

The wiring board 10 is provided with penetration electrodes (not shown) electrically connected to the first to fourth semiconductor regions FD1-FD4, the first and second gate electrodes TX1, TX2, the photogate electrodes PG, and others through the bump electrodes and others in the adhesive region AD. The penetration electrodes of the wiring board 10 are exposed in a back surface of the wiring board 10. A light shield layer (not shown) is formed on a surface on the interface side to the adhesive region AD, in an insulating substrate forming the wiring board 10, to prevent light transmitted through the range image sensor 1 from entering the wiring board 10. This ranging device is constructed so that the aforementioned signals can be supplied to the respective electrodes through respective wires when the range image sensor 1 is mounted on the wiring board 10; therefore, the device is constructed in a compact form.

When a high-level signal (positive potential) is supplied to the first and second gate electrodes TX1, TX2, potentials under the first and second gate electrodes TX1, TX2 become higher than a potential below the photogate electrode PG. This causes the negative charge (electrons) to be drawn toward the first and second gate electrodes TX1, TX2 and to be accumulated in potential wells formed by the first to fourth semiconductor regions FD1-FD4. An n-type semiconductor contains a positively ionized donor and has a positive potential, so as to attract electrons. When a low-level (the ground potential) signal is supplied to the first and second gate electrodes TX1, TX2, the potentials below the first and second gate electrodes TX1, TX2 becomes lower than the potential below the photogate electrode PG to generate barriers. Therefore, the charge generated in the semiconductor substrate 1A is not drawn into the first to fourth semiconductor regions FD1-FD4.

In the range image sensor 1, charge generated in the deep semiconductor portion in response to incidence of light for projection is drawn into potential wells provided near the charge generating position on the opposite side to the light incident surface 1BK to enable fast and accurate ranging.

The pulsed light L$_D$ from the object incident through the light incident surface (back surface) 1BK of the semiconductor substrate 1A reaches the region immediately below the photogate electrode PG provided on the front surface side of the semiconductor substrate 1A. The charge generated in the semiconductor substrate 1A with incidence of the pulsed light is distributed from the region immediately below the photogate electrode PG, into the regions immediately below the first and second gate electrodes TX1, TX2 adjacent thereto. Namely, when the detection gate signals S$_1$, S$_2$ synchronized with the drive signal S$_P$ of the light source are alternately supplied through the wiring board 10 to the first and second gate electrodes TX1, TX2, charges generated in the region immediately below the photogate electrode PG flow into the respective regions immediately below the first and second gate electrodes TX1, TX2 and then flow therefrom into the first to fourth semiconductor regions FD1-FD4.

The ratio of the charge quantity Q1 or Q2 accumulated in the first and third semiconductor regions FD1, FD3 or in the second and fourth semiconductor regions FD2, FD4 to the total charge quantity (Q1+Q2) corresponds to the phase difference between the emitted pulsed light emitted with supply of the drive signal S$_P$ to the light source and the detected pulsed light returning after reflection of the emitted pulsed light on the object H.

The generating region of charge generated according to incidence of near-infrared light is closer to the front surface 1FT on the opposite side than to the light incident surface 1BK of the semiconductor substrate 1A. For this reason, even if the charge distribution speed is increased by increasing the frequency of the drive signals (detection gate signals S$_1$, S$_2$) to the first and second gate electrodes TX1, TX2, a majority of charge flows from the region immediately below the photogate electrode PG into the first to fourth semiconductor regions FD1-FD4. Then the accumulated charges Q1, Q2 can be read out through the wires (not shown) of the wiring board 10 from these regions.

The range image sensor 1 is provided with a back gate semiconductor region for fixing the potential of the semiconductor substrate 1A to a reference potential, which is not shown. The back gate semiconductor region is a p-type semiconductor region containing a high-concentration impurity, and is provided in the well regions W1-W4. Instead of the back gate semiconductor region, the sensor may have a p-type semiconductor layer such as a p-type diffusion region and be provided with a penetrate electrode in electrical connection thereto.

Figure 7:
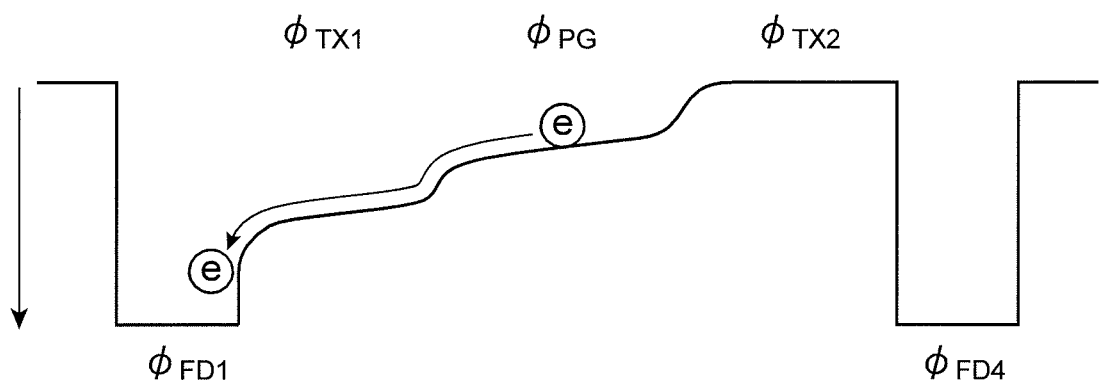
FIG. 7 is a drawing showing potential profiles near a surface of a semiconductor substrate.
Figure 7:
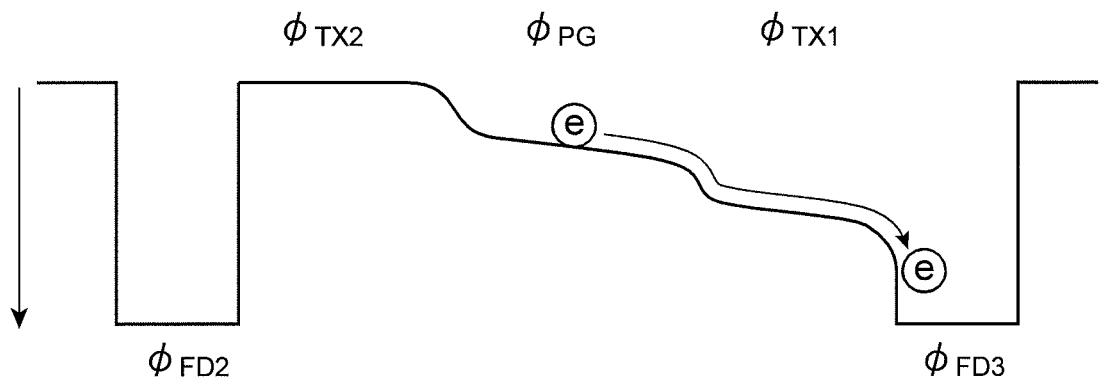
Figure 8:
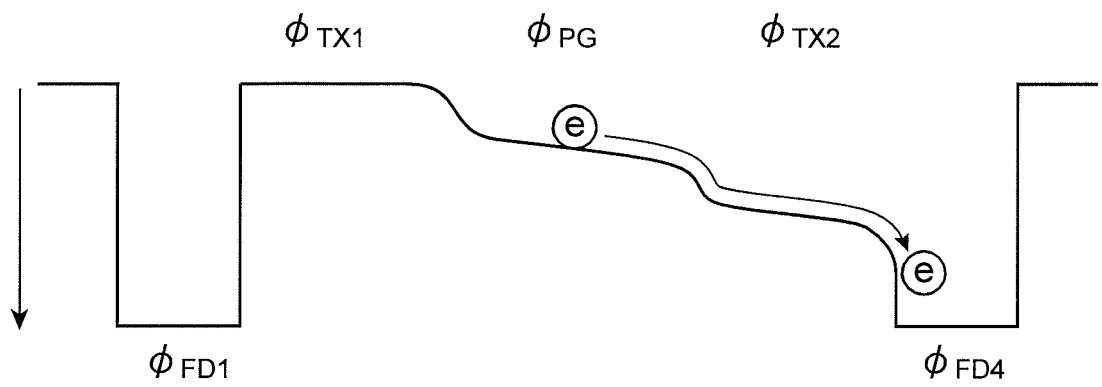
FIG. 8 is a drawing showing potential profiles near the surface of the semiconductor substrate.
Figure 8:
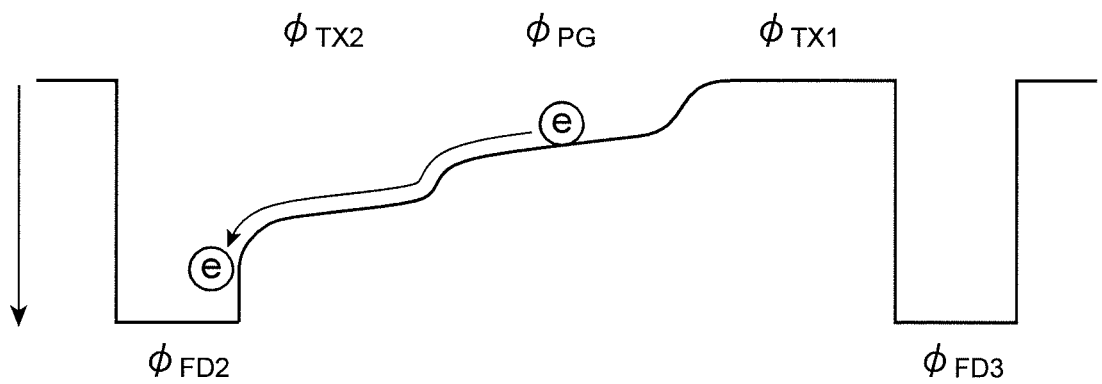

FIGS. 7 and 8 are drawings showing potential profiles near the surface 1FT of the semiconductor substrate 1A, for explaining the accumulation operation of signal charge. In FIGS. 7 and 8, the downward direction is the positive direction of potential. In FIGS. 7 and 8, (a) shows the potential profile along the lateral direction of the lateral cross section of FIG. 5. In FIGS. 7 and 8, (b) shows the potential profile along the lateral direction of the lateral cross section of FIG. 6.

Upon incidence of light, the potential $\Phi_{PG}$ of the region immediately below the photogate electrode PG is set slightly higher than the substrate potential. In each drawing there are shown the potential $\Phi_{TX1}$ of the regions immediately below the first gate electrodes TX1, the potential $\Phi_{TX2}$ of the regions immediately below the second gate electrodes TX2, the potential $\Phi_{FD1}$ of the first semiconductor region FD1, the potential $\Phi_{FD2}$ of the second semiconductor region FD2, the potential $\Phi_{FD3}$ of the third semiconductor region FD3, and the potential $\Phi_{FD4}$ of the fourth semiconductor region FD4.

When the high potential of the detection gate signal S$_1$ is fed to the first gate electrodes TX1, the charge generated immediately below the photogate electrode PG flows through the regions immediately below the first gate electrodes TX1 in accordance with a potential gradient to be accumulated in the potential wells of the first and third semiconductor regions FD1, FD3, as shown in FIG. 7. The charge quantity Q1 is accumulated in the respective potential wells of the first and third semiconductor regions FD1, FD3.

When the high potential of the detection gate signal $S_2$ is fed to the second gate electrodes TX2, subsequent to the detection gate signal $S_1$, the charge generated immediately below the photogate electrode PG flows through the regions immediately below the second gate electrodes TX2 in accordance with a potential gradient to be accumulated in the potential wells of the second and fourth semiconductor regions FD2, FD4, as shown in FIG. 8. The charge quantity $Q_2$ is accumulated in the respective potential wells of the second and fourth semiconductor regions FD2, FD4.

Figure 9:
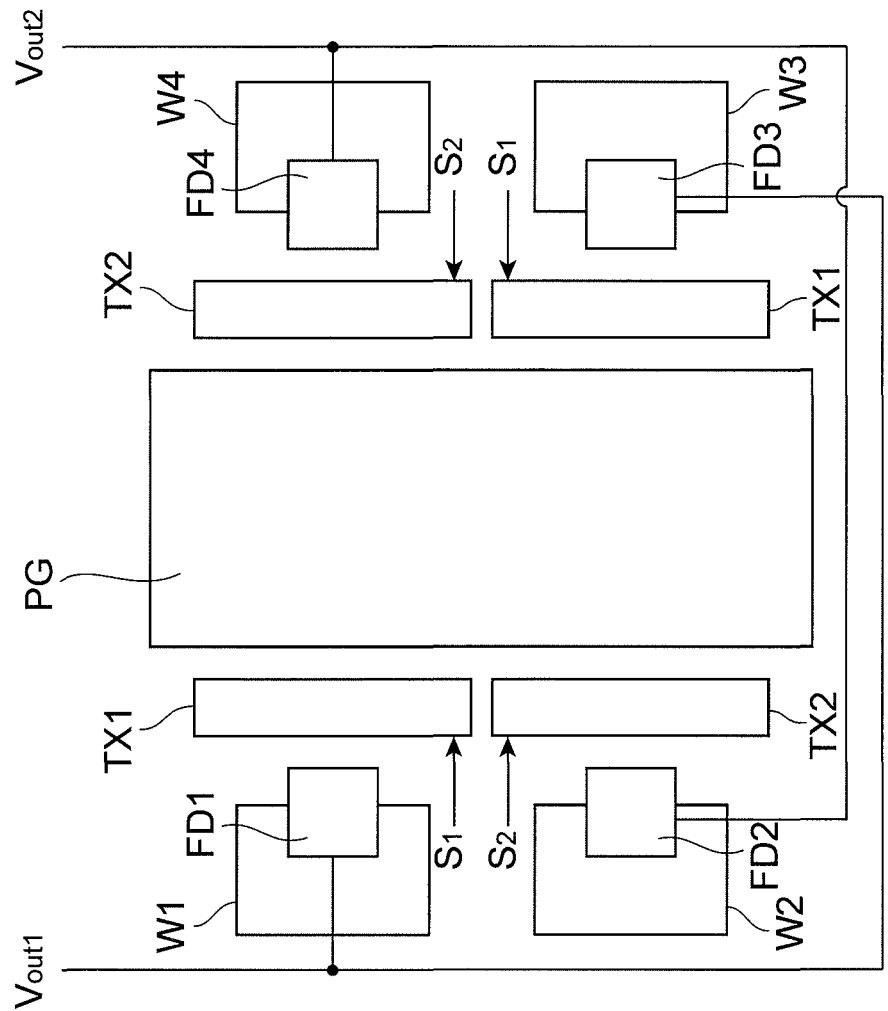
FIG. 9 is a schematic drawing for explaining a configuration of a pixel.

FIG. 9 is a schematic drawing for explaining a configuration of a pixel.

The detection gate signal $S_1$ is supplied to the first gate electrodes TX1. The detection gate signal $S_2$ is supplied to the second gate electrodes TX2. Namely, the charge transfer signals of different phases are supplied to the first gate electrodes TX1 and to the second gate electrodes TX2.

When the detection gate signal $S_1$ of the high level is supplied to the first gate electrodes TX1, the charge generated in the photosensitive region immediately below the photogate electrode PG flows as signal charge into the potential wells composed of the first and third semiconductor regions FD1, FD3. The signal charge accumulated in the first and third semiconductor regions FD1, FD3 is read out as an output ($V_{out1}$) corresponding to the accumulated charge quantity $Q_1$ from the first and third semiconductor regions FD1, FD3. When the detection gate signal $S_2$ of the high level is supplied to the second gate electrodes TX2, the charge generated in the photosensitive region immediately below the photogate electrode PG flows as signal charge into the potential wells composed of the second and fourth semiconductor regions FD2, FD4. The signal charge accumulated in the second and fourth semiconductor regions FD2, FD4 is read out as an output ($V_{out2}$) corresponding to the accumulated charge quantity $Q_2$ from the second and fourth semiconductor regions FD2, FD4. These outputs ($V_{out1}, V_{out2}$) correspond to the aforementioned signal d'(m,n).

In the aforementioned range image sensor 1, the first and second semiconductor regions FD1, FD2 are arranged on the side where the first long side LS1 of the photogate electrode PG exists. The first gate electrode TX1 is disposed between the photogate electrode PG and the first semiconductor region FD1. The second gate electrode TX2 is disposed between the photogate electrode PG and the second semiconductor region FD2. The third and fourth semiconductor regions FD3, FD4 are arranged on the side where the second side of the photogate electrode PG exists. The first gate electrode TX1 is disposed between the photogate electrode PG and the third semiconductor region FD3. The second gate electrode TX2 is disposed between the photogate electrode PG and the fourth semiconductor region FD4.

Figure 10:
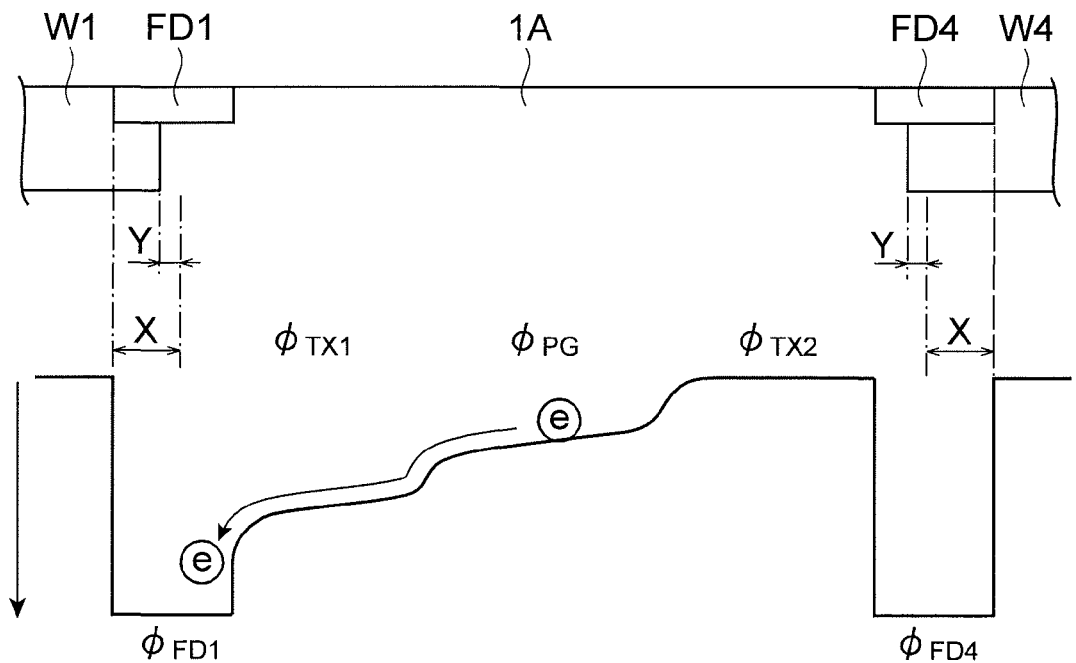
FIG. 10 is a drawing showing potential profiles near the surface of the semiconductor substrate.
Figure 10:
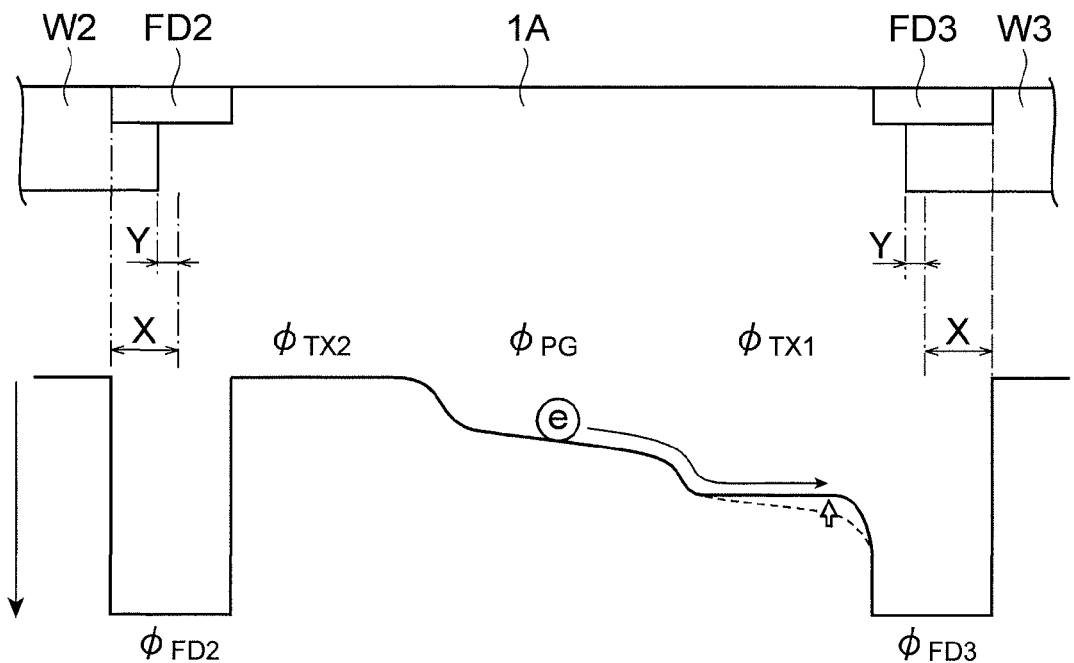
Figure 11:
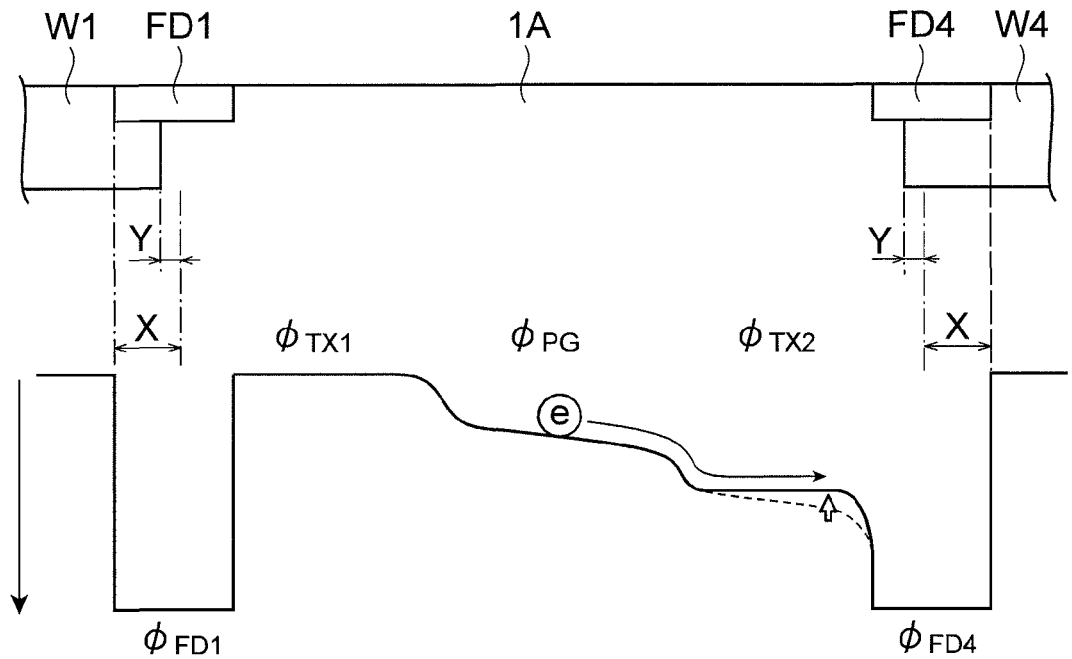
FIG. 11 is a drawing showing potential profiles near the surface of the semiconductor substrate.
Figure 11:
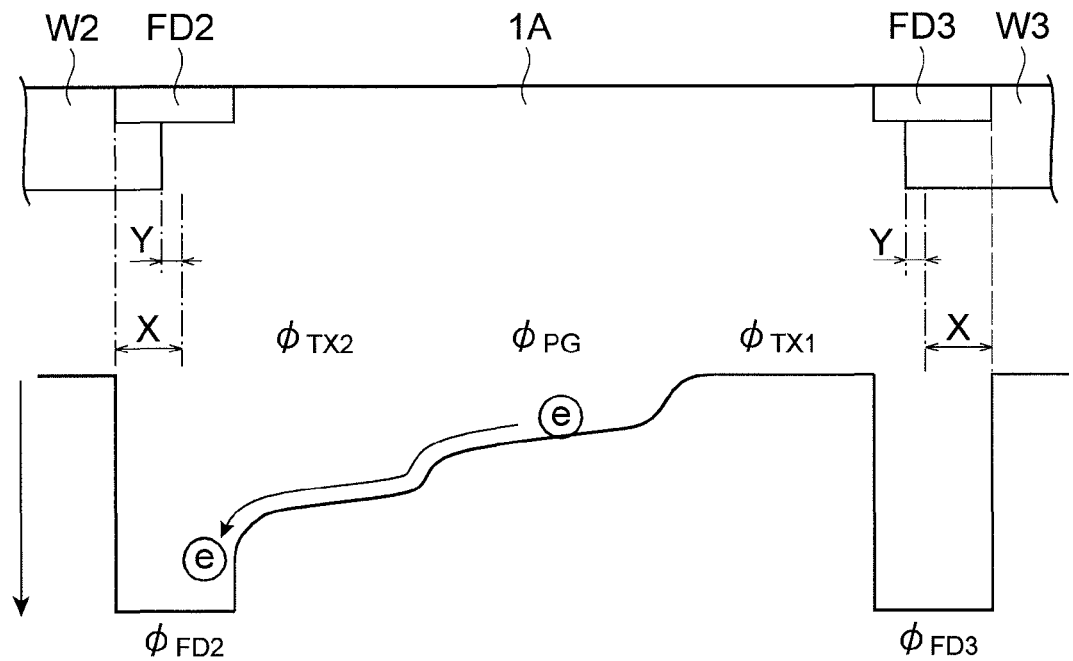

If during formation of the first to fourth semiconductor regions FD1-FD4 and the well regions W1-W4 masks for formation of the respective regions have a positional deviation in the direction in which the first and second long sides LS1, LS2 are opposed, overlap regions between the first to fourth semiconductor regions FD1-FD4 and the well regions W1-W4 will have different widths in the aforementioned opposed direction, as shown in FIGS. 10 and 11. In FIGS. 10 and 11, the well regions W1-W4 are formed with the positional deviation of distance Y to the left in the drawing, relative to the first to fourth semiconductor regions FD1-FD4. In FIGS. 10 and 11, "X" represents a design reference value for the width in the opposed direction of the overlap regions between the first to fourth semiconductor regions FD1-FD4 and the well regions W1-W4. In FIGS. 10 and 11, (a) shows a potential profile along the lateral direction of the lateral cross section of FIG. 5. In FIGS. 10 and 11, (b) shows a potential profile along the lateral direction of the lateral cross section of FIG. 6.

If the width of the overlap region between the third semiconductor region FD3 and the well region W3 increases in the opposed direction, a flat portion will be formed in the potential slope toward the third semiconductor region FD3, as shown in FIG. 10 (b), so as to cause a hindrance to flow of charge. However, the width of the overlap region between the first semiconductor region FD1 and the well region W1 will decrease in the opposed direction, as shown in FIG. 10 (a), and thus no flat portion is formed in the potential slope toward the first semiconductor region FD1, so as to cause no hindrance to flow of charge. In FIG. 10, in the case where the well regions W1-W4 are formed with the positional deviation of distance Y to the right in the drawing, relative to the first to fourth semiconductor regions FD1-FD4, no flat portion will be formed in the potential slope toward the third semiconductor region FD3, so as to cause no hindrance to flow of charge.

If the width of the overlap region between the fourth semiconductor region FD4 and the well region W4 increases in the opposed direction, a flat portion is formed in the potential slope toward the fourth semiconductor region FD4, as shown in FIG. 11 (a), so as to cause a hindrance to flow of charge. However, the width of the overlap region between the second semiconductor region FD2 and the well region W2 will decrease in the opposed direction, as shown in FIG. 11 (b), and thus no flat portion is formed in the potential slope toward the second semiconductor region FD2, so as to cause no hindrance to flow of charge. In FIG. 11, if the well regions W1-W4 are formed with the positional deviation of distance Y to the right in the drawing, relative to the first to fourth semiconductor regions FD1-FD4, no flat portion will be formed in the potential slope toward the fourth semiconductor region FD4, so as to cause no hindrance to flow of charge.

From the above discussion, the charge generated in the region immediately below the photogate electrode PG can be appropriately distributed into the first and third semiconductor regions FD1, FD3 and into the second and fourth semiconductor regions FD2, FD4 even if there occurs the positional deviation of the masks in formation of the first to fourth semiconductor regions FD1-FD4 and the well regions W1-W4. As a result, it is feasible to suppress an imbalance due to the positional deviation of the masks between the charge quantity Q1 accumulated in the first and third semiconductor regions FD1, FD3 and the charge quantity Q2 accumulated in the second and fourth semiconductor regions FD2, FD4. Therefore, the range image sensor 1 is able to prevent the degradation of distance detection accuracy.

The above described the preferred embodiment of the present invention, but it should be noted that the present invention is not always limited to the above-described embodiment but can be modified in many ways without departing from the scope and spirit of the invention.

Figure 12:
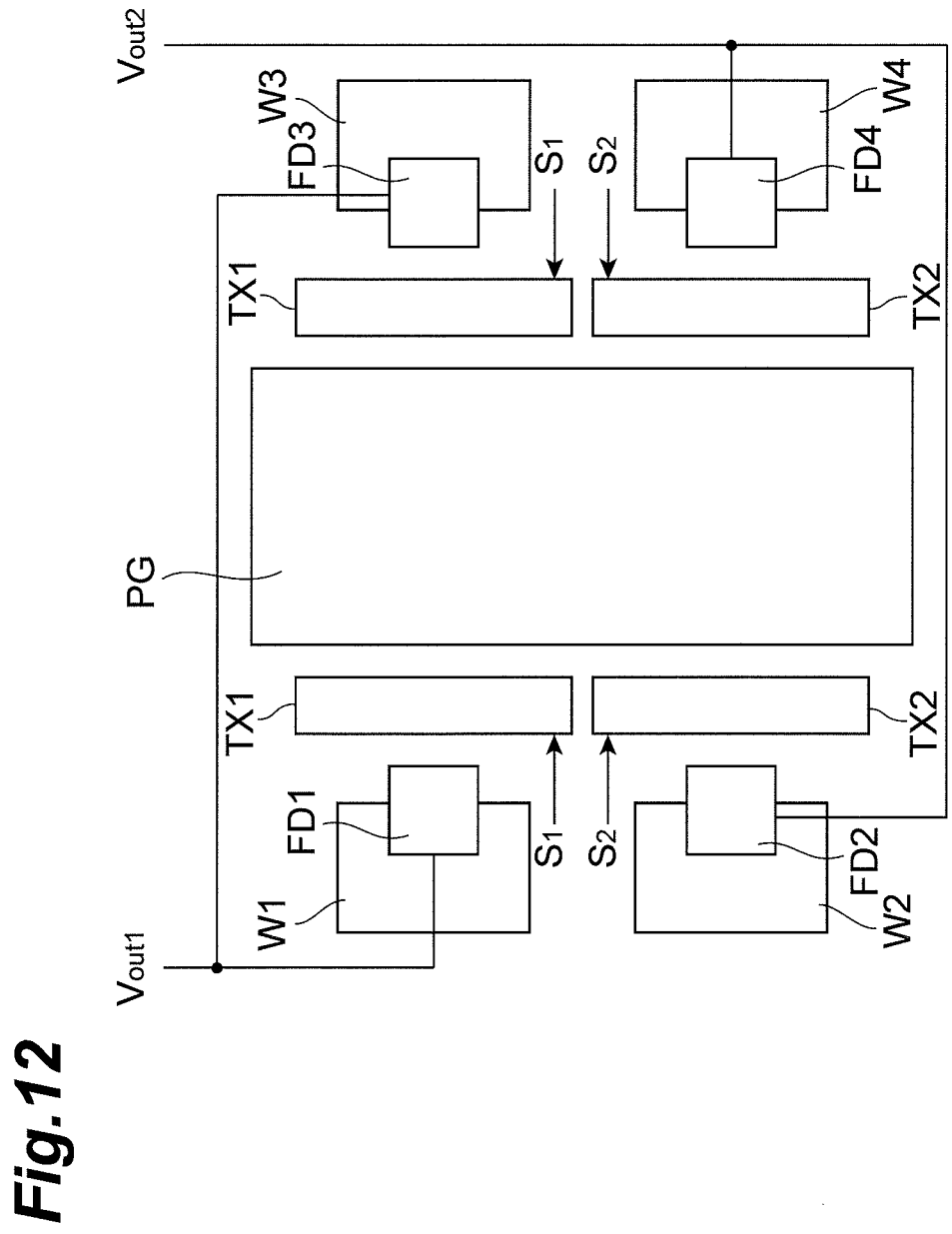
FIG. 12 is a schematic drawing for explaining a configuration of a pixel in a modification example of the range image sensor.

In each pixel of the range image sensor, as shown in FIG. 12, the first semiconductor region FD1 and the third semiconductor region FD3 may be opposed to each other with the photogate electrode PG in between in the direction in which the first and second long sides LS1, LS2 are opposed. The second semiconductor region FD2 and the fourth semiconductor region FD4 may be opposed to each other with the photogate electrode PG in between in the foregoing opposed direction.

Figure 13:
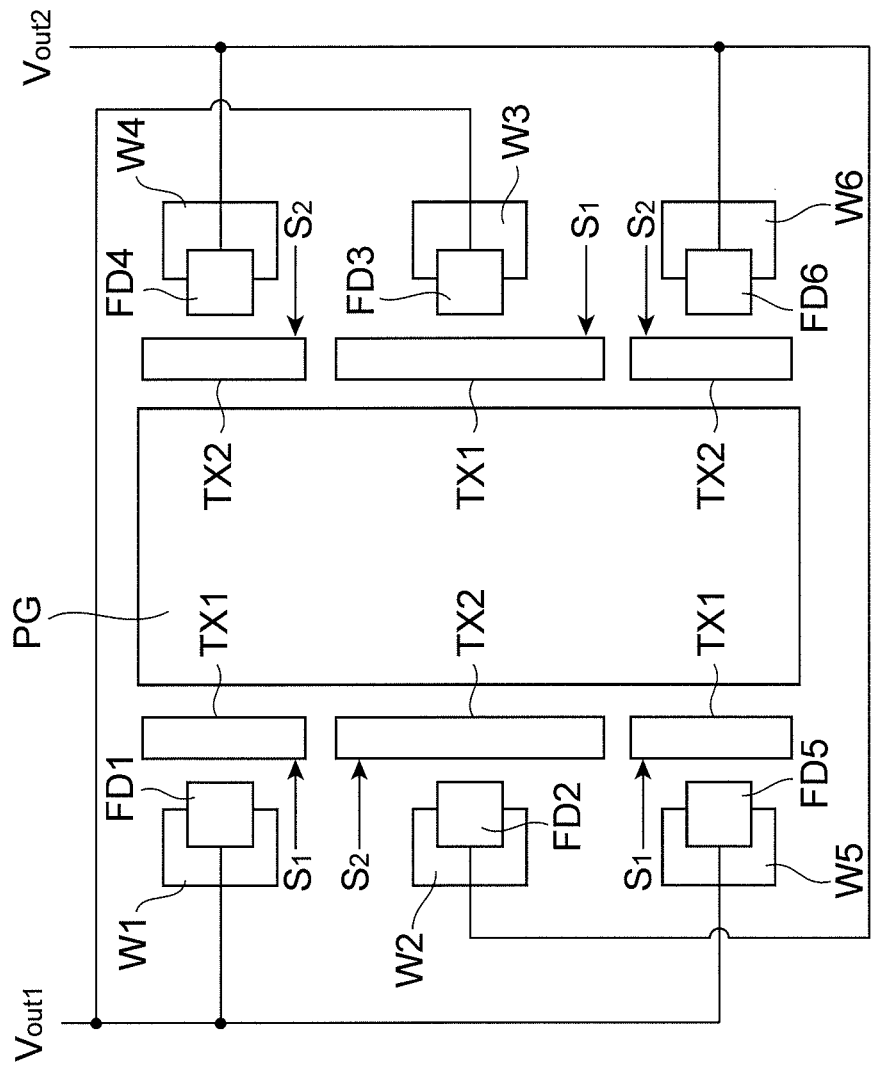
FIG. 13 is a schematic drawing for explaining a configuration of a pixel in a modification example of the range image sensor.

As shown in FIG. 13, each pixel of the range image sensor may further comprise fifth and sixth semiconductor regions FD5, FD6. The fifth and sixth semiconductor regions FD5, FD6, like the first to fourth semiconductor regions FD1-FD4, are floating diffusion regions comprised of an n-type semiconductor with a high impurity concentration. The fifth and sixth semiconductor regions FD5, FD6 are formed so as to overlap with respective p-type well regions W5, W6 and be surrounded thereby.

The fifth semiconductor region FD5 is arranged as spatially separated from the first and second semiconductor regions FD1, FD2 on the side where the first long side LS1 of the photogate electrode PG exists and along the first long side LS1. The second semiconductor region FD2 is located between the first semiconductor region FD1 and the fifth semiconductor region FD5 in the long-side direction of the photogate electrode PG. The first gate electrode TX1 is disposed between the photogate electrode PG and the fifth semiconductor region FD5.

The sixth semiconductor region FD6 is arranged as spatially separated from the third and fourth semiconductor regions FD3, FD4 on the side where the second long side LS2 of the photogate electrode PG exists and along the second long side LS2. The third semiconductor region FD3 is located between the fourth semiconductor region FD4 and the sixth semiconductor region FD6 in the long-side direction of the photogate electrode PG. The second gate electrode TX2 is disposed between the photogate electrode PG and the sixth semiconductor region FD6. The fifth semiconductor region FD5 and the sixth semiconductor region FD6 are opposed to each other with the photogate electrode PG in between in the direction in which the first and second long sides LS1, LS2 are opposed.

The length in the long-side direction of the first gate electrode TX1 located between the photogate electrode PG and the third semiconductor region FD3 is set to be approximately twice as long as the length in the long-side direction of the first gate electrodes TX1 located between the photogate electrode PG and the first and fifth semiconductor regions FD1, FD5.

The length in the long-side direction of the second gate electrode TX2 located between the photogate electrode PG and the second semiconductor region FD2 is set to be approximately twice as long as the length in the long-side direction of the second gate electrodes TX2 located between the photogate electrode PG and the fourth and sixth semiconductor regions FD4, FD6. The length in the long-side direction of the second gate electrode TX2 located between the photogate electrode PG and the second semiconductor region FD2 is set to be equal to the length in the long-side direction of the first gate electrode TX1 located between the photogate electrode PG and the third semiconductor region FD3.

On the side where the first long side LS1 of the photogate electrode PG exists, a total of the lengths in the long-side direction of the respective first gate electrodes TX1 located between the photogate electrode PG and the respective semiconductor regions FD1, FD5 is approximately equal to the length in the long-side direction of the second gate electrode TX2 located between the photogate electrode PG and the second semiconductor region FD2. On the side where the second long side LS2 of the photogate electrode PG exists, a total of the lengths in the long-side direction of the respective second gate electrodes TX2 between the photogate electrode PG and the respective semiconductor regions FD4, FD6 is approximately equal to the length in the long-side direction of the first gate electrode TX1 located between the photogate electrode PG and the third semiconductor region FD3. In this case, it is feasible to further suppress an imbalance due to the positional deviation of the masks between the charge quantity accumulated in the first, third, and fifth semiconductor regions FD1, FD3, FD5 and the charge quantity accumulated in the second, fourth, and sixth semiconductor regions FD2, FD4, FD6.

Figure 14:
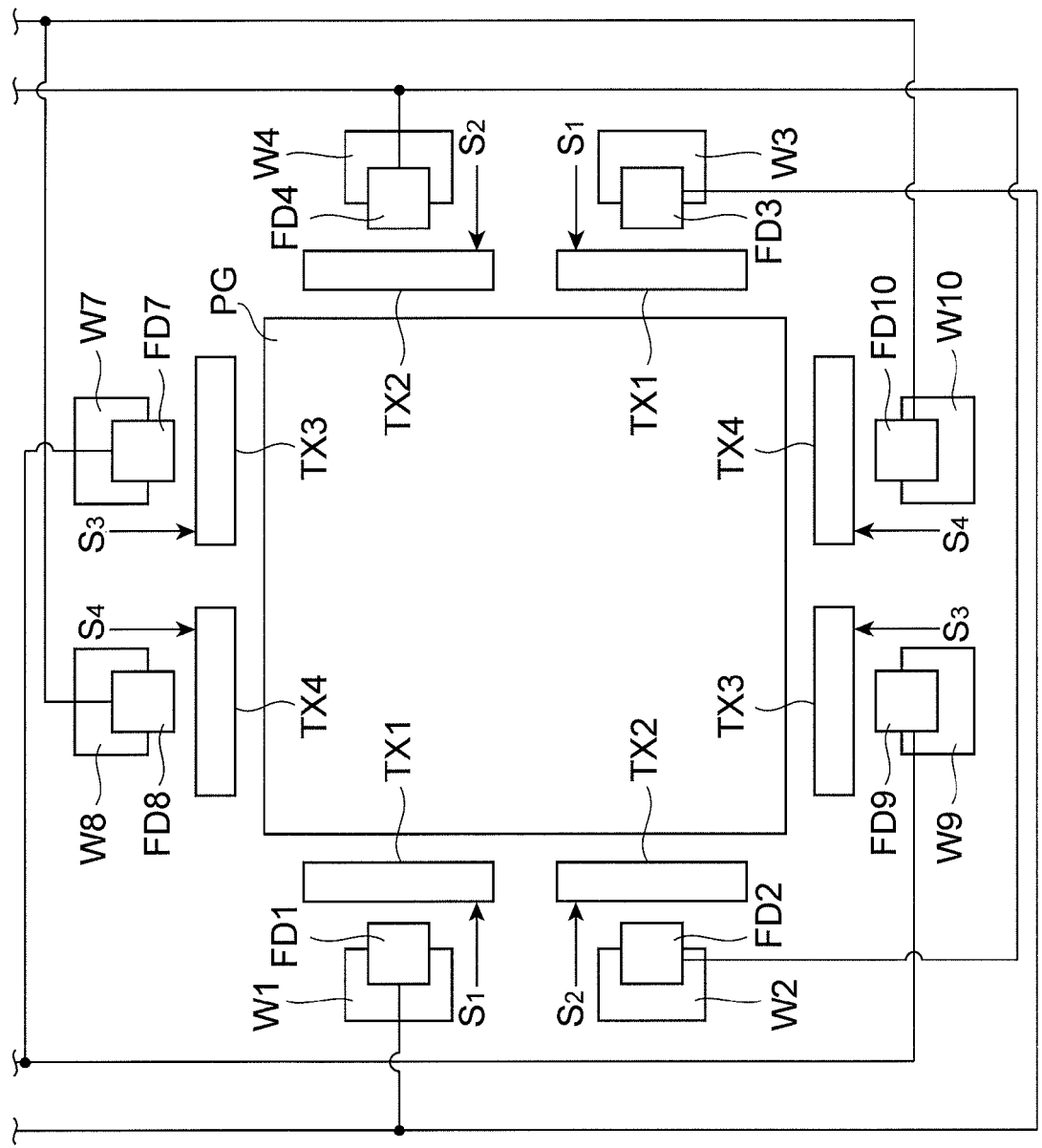
FIG. 14 is a schematic drawing for explaining a configuration of a pixel in a modification example of the range image sensor.

As shown in FIG. 14, each pixel of the range image sensor may further comprise seventh to tenth semiconductor regions FD7-FD10 and third and fourth gate electrodes TX3, TX4. Third and fourth gate electrodes TX3, TX4, like the first and second gate electrodes TX1, TX2, are provided next to the photogate electrode PG through the insulating layer 1E on the surface 1FT.

The photogate electrode PG has a square shape on the plan view. Namely, the photogate electrode PG has a planar shape with first and second sides opposed to each other and third and fourth sides opposed to each other. The first and second semiconductor regions FD1, FD2 are arranged as spatially separated from each other on the side where the first side of the photogate electrode PG exists and along the first side. The third and fourth semiconductor regions FD3, FD4 are arranged as spatially separated from each other on the side where the second side of the photogate electrode PG exists and along the second side.

The seventh and eighth semiconductor regions FD7, FD8 are arranged as spatially separated from each other on the side where the third side of the photogate electrode PG exists and along the third side. The ninth and tenth semiconductor regions FD9, FD10 are arranged as spatially separated from each other on the side where the fourth side of the photogate electrode PG exists and along the fourth side. The seventh semiconductor region FD7 and the tenth semiconductor region FD10 are opposed to each other with the photogate electrode PG in between in a direction in which the third and fourth sides are opposed (which will also be sometimes referred to hereinafter simply as "opposed direction"). The eighth semiconductor region FD8 and the ninth semiconductor region FD9 are opposed to each other with the photogate electrode PG in between in the foregoing opposed direction.

The third gate electrode TX3 is disposed between the photogate electrode PG and the seventh semiconductor region FD7. The fourth gate electrode TX4 is disposed between the photogate electrode PG and the eighth semiconductor region FD8. The third gate electrode TX3 is also disposed between the photogate electrode PG and the ninth semiconductor region FD9. The fourth gate electrode TX4 is also disposed between the photogate electrode PG and the tenth semiconductor region FD10. The third and fourth gate electrodes TX3, TX4 have a rectangular shape on the plan view. In the present embodiment, the third and fourth gate electrodes TX3, TX4 have a rectangle shape having the long-side direction parallel to the direction in which the third side (fourth side) of the photogate electrode PG extends. The first to fourth gate electrodes TX1-TX4 have the same length in the long-side direction. The third and fourth gate electrodes TX3, TX4 are also comprised of polysilicon, but they may be comprised of another material different from it.

A detection gate signal $S_3$ is supplied to the third gate electrodes TX3. A detection gate signal $S_4$ is supplied to the fourth gate electrodes TX4. The charge transfer signals with different phases are supplied to the first to fourth gate electrodes TX1-TX4.

The seventh to tenth semiconductor regions FD7-FD10, like the first to fourth semiconductor regions FD1-FD4, are floating diffusion regions comprised of an n-type semiconductor with a high impurity concentration. The seventh to tenth semiconductor regions FD7-FD10 are formed so as to overlap with respective p-type well regions W7-W10 and surrounded thereby. The perimeters of the seventh to tenth semiconductor regions FD7-FD10 are surrounded by the respective well regions W7-W10 having a concentration higher than the impurity concentration of the substrate and regions immediately below the third and fourth gate electrodes TX3, TX4. For this reason, it is feasible to suppress the spread of depletion regions from the respective semiconductor regions FD7-FD10, to reduce the leak current, and to reduce capture of unnecessary charge due to crosstalk and stray light. The well regions W7-W10, like the well regions W1-W4, prevent coupling between the depletion layer spreading with application of voltage to the photogate electrode PG and depletion layers spreading from the seventh to tenth semiconductor regions FD7-FD10.

In the range image sensor having the pixel shown in FIG. 14, even if during formation of the seventh to tenth semiconductor regions FD7-FD10 and the well regions W7-W10 masks for formation of the respective regions have a positional deviation in the opposed direction of the third and fourth sides, the charge generated in the region immediately below the photogate electrode PG can be appropriately distributed into the seventh and ninth semiconductor regions FD7, FD9 and into the eighth and tenth semiconductor regions FD8, FD10, as in the case of the relation of the first to fourth semiconductor regions FD1-FD4. As a consequence, it is feasible to prevent an imbalance due to the positional deviation of the masks between the charge quantity accumulated in the seventh and ninth semiconductor regions FD7, FD9 and the charge quantity accumulated in the eighth and tenth semiconductor regions FD8, FD10.

In the range image sensor having the pixel shown in FIG. 14, the controlling circuit 2 supplies the charge transfer signals synchronized with the pulse drive signal and having mutually different phases to the first to fourth respective gate electrodes TX1-TX4. The arithmetic circuit 5 calculates the distance to the object from signals read out from the first to fourth semiconductor regions FD1-FD4 and the seventh to tenth semiconductor regions FD7-FD10.

INDUSTRIAL APPLICABILITY

The present invention is applicable to the range sensors and the range image sensors mounted on product monitors in manufacture lines in factories, vehicles, and so on.

LIST OF REFERENCE SIGNS 1 range image sensor; 1A semiconductor substrate; 2 controlling circuit; 3 light source; 4 driving circuit; 5 arithmetic circuit; FD1-FD10 first to tenth semiconductor regions; LS1 first long side; LS2 second long side; P pixel; PG photogate electrode; $S_1$-$S_4$ detection gate signals; TX1-TX4 first to fourth gate electrodes; W1-W10 well regions.

The invention claimed is:

1. A range sensor comprising:
a semiconductor substrate;
a photogate electrode provided on a surface of the semiconductor substrate and having a planar shape with a first side and a second side opposed to each other;
first and second semiconductor regions arranged as spatially separated from each other on the side where the first side of the photogate electrode exists and along the first side, having a conductivity type different from that of the semiconductor substrate, and configured to accumulate charge generated in a region immediately below the photogate electrode;
third and fourth semiconductor regions arranged as spatially separated from each other on the side where the second side of the photogate electrode exists and along the second side and as opposed to the first and second semiconductor regions with the photogate electrode in between in an opposed direction in which the first side and the second side are opposed, having the conductivity type different from that of the semiconductor substrate, and configured to accumulate charge generated in the region immediately below the photogate electrode;
well regions having the same conductivity type as the semiconductor substrate and an impurity concentration higher than an impurity concentration of the semiconductor substrate, and provided so as to overlap with the first to fourth respective semiconductor regions; and
first transfer electrodes provided respectively between the first and third semiconductor regions and the photogate electrode on the surface and second transfer electrodes provided respectively between the second and fourth semiconductor regions and the photogate electrode on the surface, to which charge transfer signals of different phases are supplied.

2. The range sensor according to claim 1, further comprising:
a fifth semiconductor region arranged as spatially separated from the first and second semiconductor regions on the side where the first side of the photogate electrode exists and along the first side, having the conductivity type different from that of the semiconductor substrate, and configured to accumulate charge generated in the region immediately below the photogate electrode; and
a sixth semiconductor region arranged as spatially separated from the third and fourth semiconductor regions on the side where the second side of the photogate electrode exists and along the second side and as opposed to the fifth semiconductor region with the photogate electrode in between in the opposed direction, having the conductivity type different from that of the semiconductor substrate, and configured to collect charge generated in the region immediately below the photogate electrode,
wherein the well regions are provided so as to overlap with the fifth and sixth respective semiconductor regions,
the range sensor further comprising:
the first transfer electrode disposed between the fifth semiconductor region and the photogate electrode on the surface; and
the second transfer electrode disposed between the sixth semiconductor region and the photogate electrode on the surface.

3. The range sensor according to claim 2,
wherein on each side of the first side and the second side, a total of lengths of the first transfer electrodes is equal to a total of lengths of the second transfer electrodes.

4. A range image sensor comprising:
the range sensor as defined in claim 2;
a light source;
a driving circuit to supply a pulse drive signal to the light source;
a controlling circuit to supply charge transfer signals synchronized with the pulse drive signal and having mutually different phases, to the first and second transfer electrodes, respectively; and
an arithmetic circuit to calculate a distance to an object from signals read out from the first to sixth semiconductor regions.

5. The range sensor according to claim 1,
wherein the planar shape of the photogate electrode further has a third side and a fourth side opposed to each other,
the range sensor further comprising:
seventh and eighth semiconductor regions arranged as spatially separated from each other on the side where the third side of the photogate electrode exists and along the third side, having the conductivity type different from that of the semiconductor substrate, and configured to accumulate charge generated in the region immediately below the photogate electrode;
ninth and tenth semiconductor regions arranged as spatially separated from each other on the side where the fourth side of the photogate electrode exists and along the fourth side and as opposed to each other with the photogate electrode in between in an opposed direction in which the third side and the fourth side are opposed, having the conductivity type different from that of the semiconductor substrate, and configured to accumulate charge generated in the region immediately below the photogate electrode; and
third transfer electrodes provided respectively between the seventh and ninth semiconductor regions and the photogate electrode on the surface and fourth transfer electrodes provided respectively between the eighth and tenth semiconductor regions and the photogate electrode on the surface, to which charge transfer signals of different phases are supplied,
wherein the well regions are provided so as to overlap with the seventh to ninth respective semiconductor regions.

6. A range image sensor comprising:
the range sensor as defined in claim 5;
a light source;
a driving circuit to supply a pulse drive signal to the light source;
a controlling circuit to supply charge transfer signals synchronized with the pulse drive signal and having mutually different phases, to the first to fourth transfer electrodes, respectively; and
an arithmetic circuit to calculate a distance to an object from signals read out from the first to fourth semiconductor regions and the seventh to tenth semiconductor regions.

7. A range image sensor comprising:
the range sensor as defined in claim 1;
a light source;
a driving circuit to supply a pulse drive signal to the light source;
a controlling circuit to supply charge transfer signals synchronized with the pulse drive signal and having mutually different phases, to the first and second transfer electrodes, respectively; and
an arithmetic circuit to calculate a distance to an object from signals read out from the first to fourth semiconductor regions.

* * * * *